US010822226B2

(12) United States Patent
Lee et al.

(10) Patent No.: US 10,822,226 B2
(45) Date of Patent: Nov. 3, 2020

(54) SEMICONDUCTOR PACKAGE USING A POLYMER SUBSTRATE

(71) Applicant: Amkor Technology, Inc., Tempe, AZ (US)

(72) Inventors: Yung Woo Lee, Gyeonggi-do (KR); Byung Jun Kim, Seoul (KR); Dong Hyun Bang, Seoul (KR); EunNaRa Cho, Seoul (KR); Adrian Arcedera, Chandler, AZ (US); Jae Ung Lee, Seoul (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 16/255,292

(22) Filed: Jan. 23, 2019

(65) Prior Publication Data

US 2019/0152770 A1    May 23, 2019

Related U.S. Application Data

(63) Continuation of application No. 15/009,012, filed on Jan. 28, 2016, now abandoned.

(30) Foreign Application Priority Data

Jan. 30, 2015    (KR) ........................ 10-2015-0014883

(51) Int. Cl.
*B81B 7/00*    (2006.01)
(52) U.S. Cl.
CPC .... *B81B 7/0061* (2013.01); *B81B 2201/0257* (2013.01); *B81B 2207/012* (2013.01);
(Continued)
(58) Field of Classification Search
None
See application file for complete search history.

(56) References Cited

U.S. PATENT DOCUMENTS 6,528,869 B1    3/2003  Glenn et al.
8,030,722 B1 *  10/2011 Bologna .............. B81B 7/0061
                                                257/433
(Continued)

FOREIGN PATENT DOCUMENTS

KR    101060121    8/2011
KR    101091552    12/2011
(Continued)

OTHER PUBLICATIONS

Taiwanese Search Report for Appln. No. 105102983 dated Aug. 22, 2017.
(Continued)

*Primary Examiner* — Long Pham
(74) *Attorney, Agent, or Firm* — McAndrews, Held & Malloy, Ltd.

(57) ABSTRACT

A semiconductor package using a polymer substrate is disclosed and may include a polymer cavity structure comprising first metal traces, a micro-electro mechanical systems (MEMS) device and a semiconductor die bonded to a first surface within a cavity of the cavity structure, and a substrate coupled to the cavity structure and comprising second metal traces coupled to the first metal traces. The substrate may enclose the MEMS device and the semiconductor die. Ground traces may be on external surfaces of the polymer cavity structure. Ball lands may be on a surface of the substrate opposite to a surface with the second metal traces. The first metal traces may extend from the first surface of the polymer cavity structure up a sidewall of the cavity and to conductive patterns on a top surface of the polymer cavity structure.

20 Claims, 6 Drawing Sheets

(52) U.S. Cl.
CPC ............... *H01L 2224/48137* (2013.01); *H01L 2224/73265* (2013.01); *H01L 2924/15151* (2013.01)

(56) References Cited

U.S. PATENT DOCUMENTS

| | | |
|---|---|---|
| 9,029,962 B1 | 5/2015 | Dreiza et al. |
| 9,260,298 B1 | 2/2016 | Liao et al. |
| 2008/0298621 A1 | 12/2008 | Theuss et al. |
| 2012/0153771 A1 | 6/2012 | Formosa et al. |
| 2014/0037120 A1 | 2/2014 | Lim et al. |
| 2014/0131819 A1 | 5/2014 | Gritti et al. |
| 2015/0091108 A1 | 4/2015 | Huang et al. |
| 2015/0357494 A1* | 12/2015 | Dean .................. H01L 31/0481 257/790 |

FOREIGN PATENT DOCUMENTS

| | | |
|---|---|---|
| KR | 101236796 | 2/2013 |
| KR | 20130028243 | 3/2013 |
| TW | 201303503 | 1/2013 |

OTHER PUBLICATIONS

Korean Notice of Allowance dated Oct. 18, 2016 for Korean Patent Application No. KR 10-2015-0014883.

\* cited by examiner

SEMICONDUCTOR PACKAGE USING A POLYMER SUBSTRATE

CROSS REFERENCE TO RELATED APPLICATIONS

This patent application is a continuation of U.S. patent application Ser. No. 15/009,012, filed on Jan. 28, 2016, which in turn makes reference to, claims priority to and claims benefit of Korean Patent Application No. 10-2015-0014883 filed on Jan. 30, 2015. Each of the above stated applications are incorporated herein by reference in their entirety.

FIELD

Certain example embodiments of the disclosure relate to semiconductor chip packaging. More specifically, certain example embodiments of the disclosure relate to a semiconductor package using a polymer substrate.

BACKGROUND

Semiconductor packages are used in a wide variety of products. In addition, according to the recent trend toward slim, light, and compact products, in order to reduce the size of the semiconductor package, growing attention is being paid to a flip chip package having bumps directly formed on a surface of a semiconductor die or a TSV package having a through silicon via (TSV) formed near a bond pad of a semiconductor die and a solder bump formed in the TSV.

Typically, a MEMS device for converting a physical phenomenon, such as pressure, acceleration, sound or light, into an electrical signal includes a MEMS chip and an Application Specific Integrated Circuit (ASIC) chip.

As a kind of semiconductor package, the MEMS device is configured such that the MEMS chip and the ASIC chip are stacked on and attached to the upper and lower surfaces of any substrate (a printed circuit board (PCB), a lead frame, LCC, etc.), or are arranged in a lateral direction.

Further limitations and disadvantages of conventional and traditional approaches will become apparent to one of skill in the art, through comparison of such systems with the present disclosure as set forth in the remainder of the present application with reference to the drawings.

BRIEF SUMMARY

A semiconductor package using a polymer substrate, substantially as shown in and/or described in connection with at least one of the figures, as set forth more completely in the claims.

Various advantages, aspects and novel features of the present disclosure, as well as details of various illustrated example supporting embodiments, will be more fully understood from the following description and drawings.

DETAILED DESCRIPTION

Certain aspects of the disclosure may be found in a semiconductor package using a polymer substrate. Example aspects of the disclosure may comprise a polymer cavity structure comprising first metal traces, a micro-electro mechanical systems (MEMS) device and a semiconductor die bonded to a first surface within a cavity of the polymer cavity structure, and a substrate coupled to the polymer cavity structure and comprising second metal traces coupled to the first metal traces. The substrate may enclose the MEMS device and the semiconductor die within the cavity. Ground traces may be on external surfaces of the polymer cavity structure. Ball lands may be on a surface of the substrate opposite to a surface with the second metal traces. The first metal traces may extend from the first surface of the polymer cavity structure up a sidewall of the cavity and to a top surface of the polymer cavity structure. The first metal traces may extend to conductive patterns on the top surface of the polymer cavity structure, where the conductive patterns are for electrically coupling to the second metal traces of the substrate. A ground trace may be on an inside surface of the cavity of the polymer cavity structure. Wire bonds may electrically couple the semiconductor die to the first metal traces. A polymer lid may be coupled to a second surface of the polymer cavity structure, where the polymer lid comprises an orifice corresponding to a position of the MEMS device bonded to the first surface of the polymer cavity structure. Wire bonds may electrically couple the MEMS device to the semiconductor die.

Figure 1:
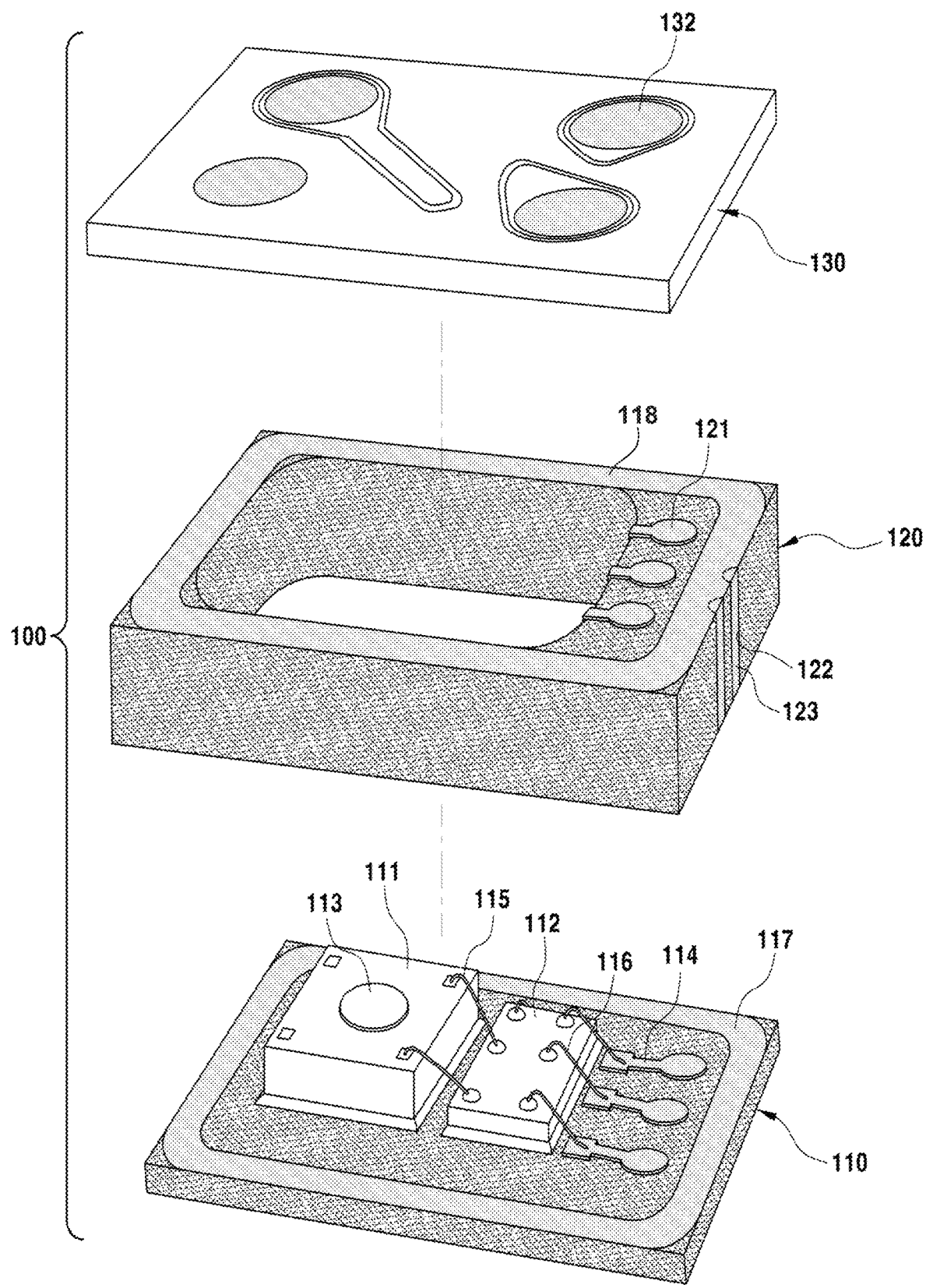
FIGS. 1 and 2 are respectively an exploded perspective view and a cross-sectional view illustrating a semiconductor package using a polymer substrate according to an embodiment of the present disclosure.
Figure 2:
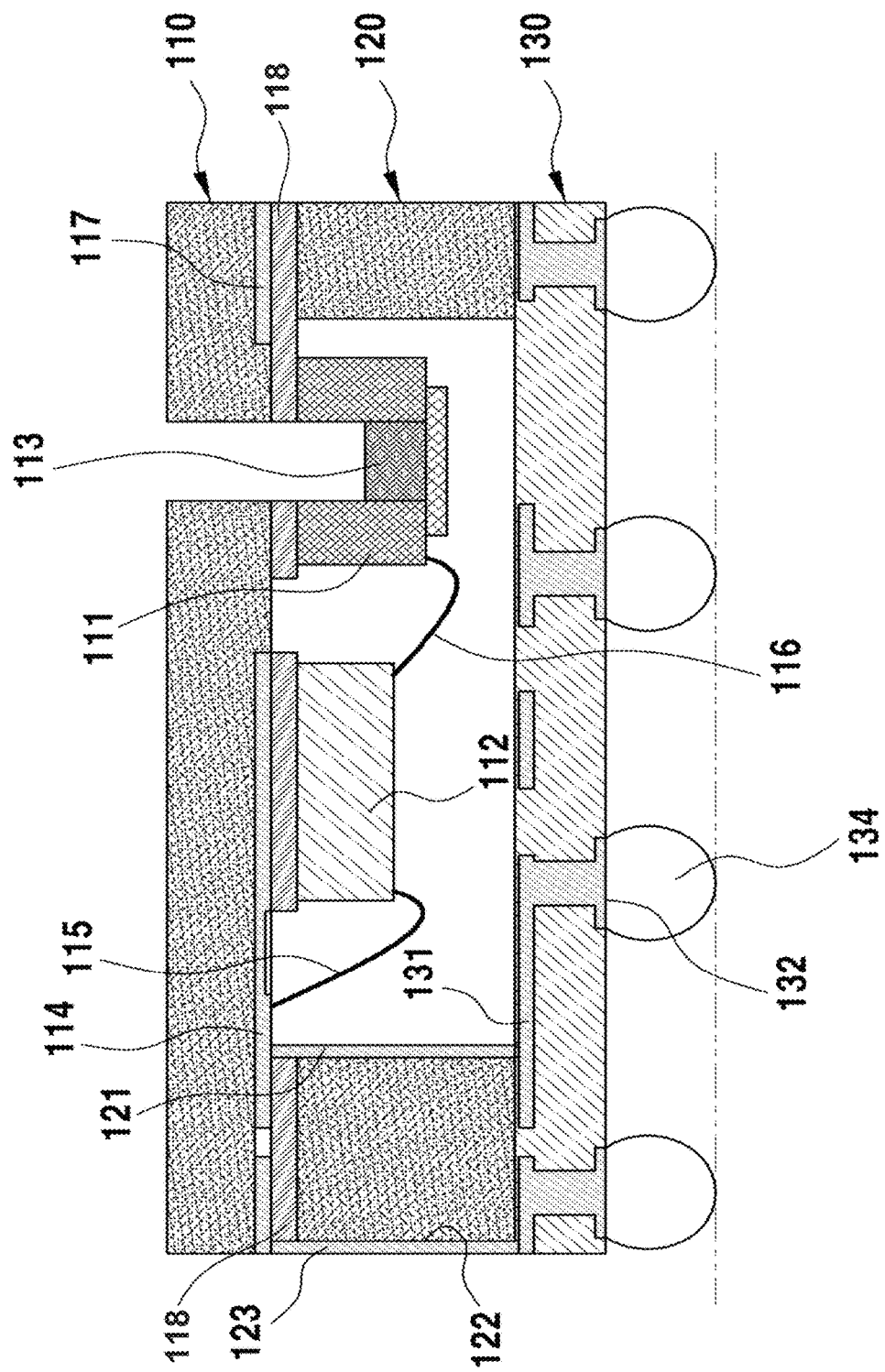

FIGS. 1 and 2 are respectively an exploded perspective view and a cross-sectional view illustrating a semiconductor package using a polymer substrate according to an embodiment of the disclosure.

As illustrated in FIGS. 1 and 2, a MEMS device 100 may for example comprise a total of three substrates, that is, an upper substrate 110, a lower substrate 130, and a cavity substrate 120 interposed between the upper substrate 110 and the lower substrate 130.

The upper substrate 110 may comprise a rectangular polymer sheet formed in an injection-molding process using a polymer material, for example.

A first semiconductor chip 111 and a second semiconductor chip 112 may be attached side by side to the upper substrate 110 molded from inexpensive polymer material.

The first semiconductor chip 111, which may comprise a MEMS chip, has a membrane 113 that senses a sound wave in a hole formed at the center of the chip, so as to be useful in microphones, handheld microphones, etc.

A plurality of first conductive patterns 114 may be formed using a plating process at one side of one surface of the upper substrate 110 so that the semiconductor chips 111, 112 may be conductively connected to the cavity substrate 120. The patterns 114 may be formed through a plating process before attachment of the semiconductor chips after injection-molding of the upper substrate 110.

Bonding pads of the first semiconductor chip 111 and bonding pads of the second semiconductor chip 112 may be electrically coupled utilizing first conductive wires 115, and bonding pads of the second semiconductor chip 112 and the first conductive patterns 114 of the upper substrate 110 may be electrically coupled utilizing second conductive wires 116.

A ground shield layer 117 for shielding electromagnetic waves may also be formed through plating, for example, on the edge of the upper substrate 110 when plating the first conductive patterns 114. The ground shield layer 117 may be electrically coupled to the ground shield material of the cavity substrate 120, as described below.

The cavity substrate 120 is provided in the form of a rectangular frame having a vertical through hole and may be formed through injection-molding, for example, using an inexpensive polymer material.

After injection-molding of the cavity substrate 120, a plurality of second conductive patterns 121, which may be conductively connected to the first conductive patterns 114 of the upper substrate 110 and to third conductive patterns 131 of the lower substrate 130, may be formed through a plating process on one surface and the inner wall of the cavity substrate 120.

The cavity substrate 120 may be injection-molded using a polymer material, for example, so that ground shield forming grooves 122 may be formed on the outer surface of one side of the cavity substrate 120. As such, the ground shield forming grooves 122 may be plated with a ground shield material thereby forming ground traces 123. In addition, a conductive pattern 118 may be formed at an outer perimeter of the cavity substrate 120, which may be utilized for a ground shield in conjunction with the ground traces 123.

The mold structure for injection-molding of the cavity substrate 120 may be configured to form an injection-molded product for the ground shield forming grooves 122, and thus the ground shield forming grooves 122 may be formed with a desired thickness, or depth, on the outer surface of one side of the cavity substrate 120. The ground shield forming grooves 122 may be plated with the ground shield material to form ground traces 123 using a plating process, for example. Other techniques, such as deposition techniques may also be utilized.

One end of the ground traces 123 may be electrically coupled to the ground shield layer 117 of the upper substrate 110 when the substrates are coupled, and the other end thereof may be electrically coupled to the third conductive patterns 131 of the lower substrate 130. The ground traces 123 may therefore provide a ground shield of side surfaces of the MEMS device 100 because the ground shield layer 117, the ground traces 123 and the ground, and conductive pattern 118 effectively surround the devices in the cavity.

The lower substrate 130 may be mounted so as to enable the exchange of electrical signals on a mother board of an electronic device (e.g. a microphone, etc.), and may comprise a printed circuit board (PCB) structure for efficient exchange of electrical signals with the electronic device.

The lower substrate 130 may be configured such that a plurality of third conductive patterns 131 may be electrically coupled to the second conductive patterns 121 of the cavity substrate 120. The third conductive patterns 131 may be on an opposite surface of the ball lands 132, which may be electrically coupled to the third conductive patterns 131 by conductive vias.

When the upper substrate 110, the cavity substrate 120, and the lower substrate 130 are stacked by means of a conductive adhesive member, the first conductive patterns 114 of the upper substrate 110 may be electrically coupled to the second conductive patterns 121 of the cavity substrate 120, and the second conductive patterns 121 of the cavity substrate 120 may be electrically coupled to the third conductive patterns 131 of the lower substrate 130.

Furthermore, when the upper substrate 110, the cavity substrate 120, and the lower substrate 130 are stacked, the ground shield layer 117 of the upper substrate 110 and the ground traces 123 of the cavity substrate 120 may be electrically coupled, and the ground traces 123 of the cavity substrate 120 may be electrically coupled to the third conductive patterns 131 of the lower substrate 130.

I/O terminals 134, such as solder balls, may be fused on, bonded to, or formed on the ball lands 132 of the lower substrate 130, thereby completing the fabrication of the MEMS device-type semiconductor package using the polymer substrate according to the present disclosure.

In operation, the membrane 113 of the first semiconductor chip 111, which is the MEMS chip, vibrates when a sound wave is introduced to the semiconductor package. As such, the membrane 113 easily vibrates as long as a space behind it is provided.

Thus, the vibration signal of the membrane 113 may be transmitted from the first semiconductor chip 111 to the second semiconductor chip 112, which may comprise an ASIC chip (e.g., an application-specific integrated circuit chip for processing sensor signals from the first semiconductor chip 111). The vibration signal may then be processed into an electrical signal, after which the electrical signal may sequentially pass through the first conductive patterns 114 of the upper substrate 110, the second conductive patterns 121 of the cavity substrate 120, and the third conductive patterns 131 of the lower substrate 130, and then output to a mother board of an electronic device (e.g. a microphone) through the IO terminals 134 of the lower substrate 130.

An electromagnetic wave from an external source may, for example, impact the ground shield layer 117 of the upper substrate 110, and the energy associated with the electromagnetic wave is shunted to ground through the ground shield material 123 of the cavity substrate 120, the third conductive patterns 131 and 10 terminals 134 of the lower substrate 130, and a grounded portion of the mother board of the electronic device (e.g. a microphone).

When the MEMS device is manufactured by stacking three substrates in this way, the lower substrate 130, which is mounted on the electronic device, may for example be formed of a PCB, the upper substrate 110 and the cavity substrate 120 may for example be injection-molded of a polymer material, and the conductive patterns may be plated on the surfaces thereof as required, thereby significantly reducing the manufacturing cost over prior designs while maintaining performance.

Figure 3:
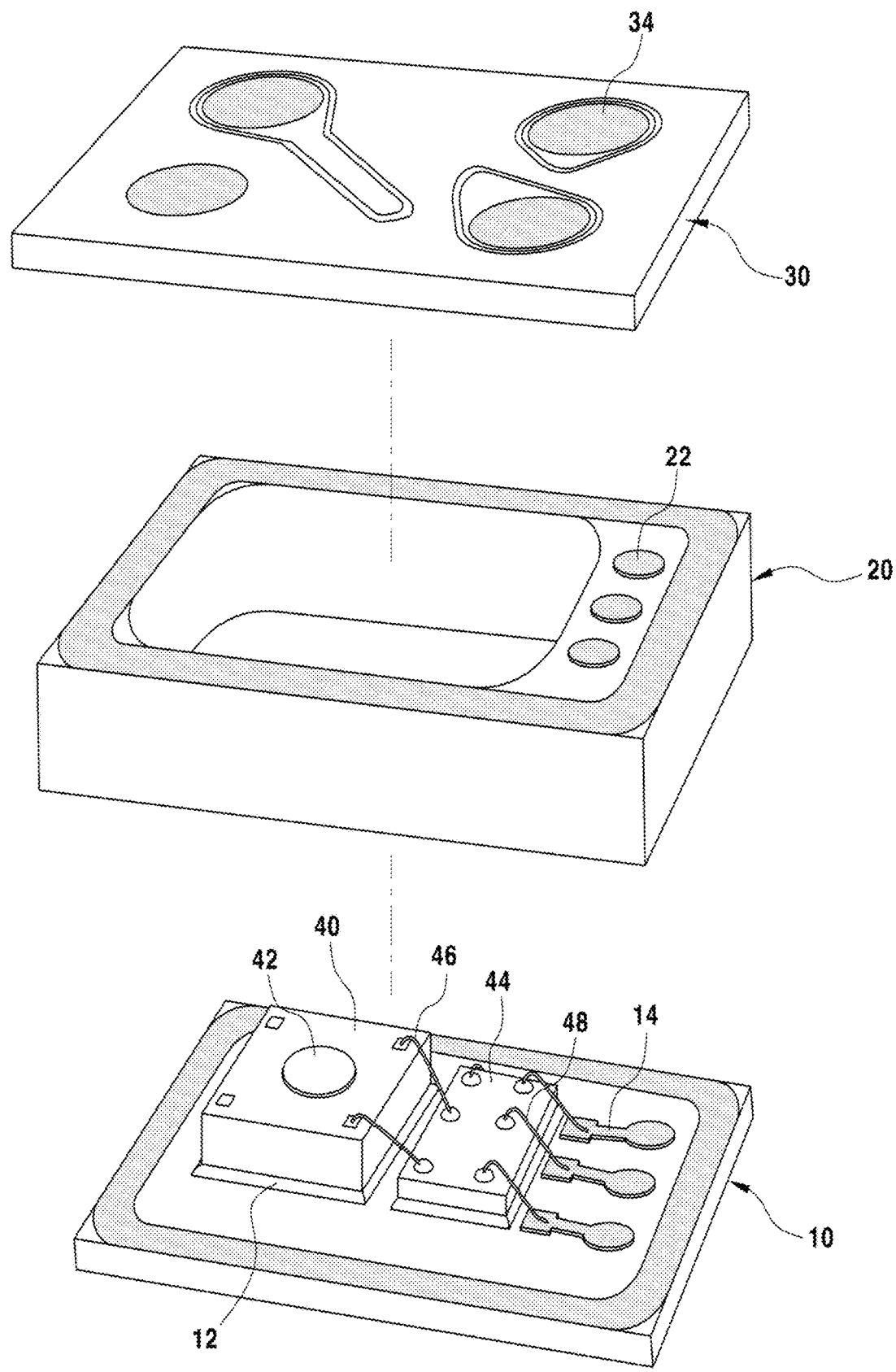
FIGS. 3 and 4 are respectively an exploded perspective view and a cross-sectional view illustrating a printed circuit board MEMS device.
Figure 4:
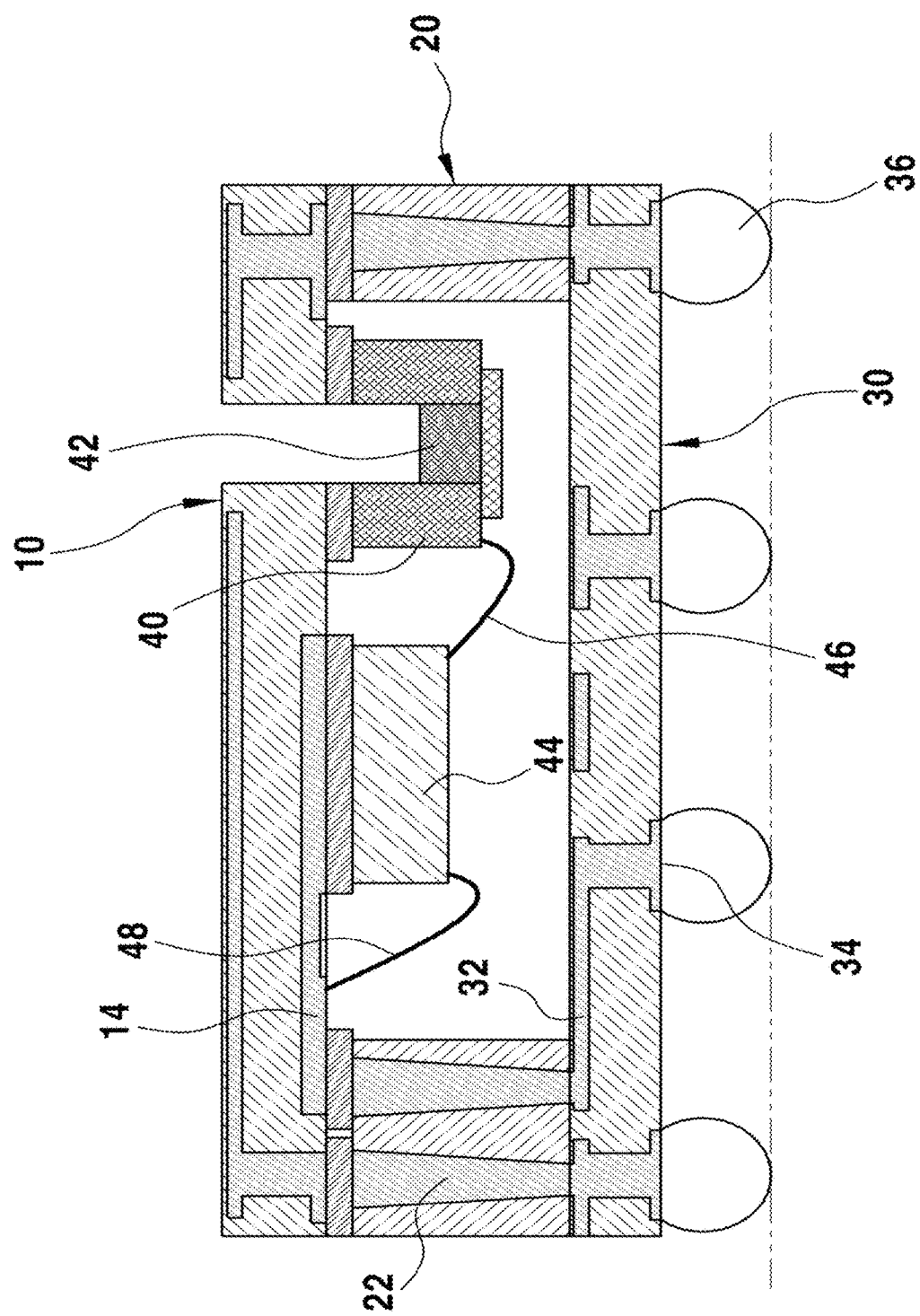

FIGS. 3 and 4 are respectively an exploded perspective view and a cross-sectional view illustrating a printed circuit board (PCB) MEMS device. The PCB MEMS device may for example be manufactured using a total of three PCBs, including an upper substrate 10, a lower substrate 30, and a cavity substrate 20 interposed between the upper substrate 10 and the lower substrate 30.

The upper substrate 10 may be configured such that a semiconductor chip attachment region 12 is formed on one surface thereof, and first conductive patterns 14 for wire bonding are formed to be exposed on the outer periphery of the semiconductor chip attachment region 12.

The cavity substrate 20 is provided in the form of a rectangular frame, the top and bottom of which are open, and one side of which is formed with conductive via holes 22 (or conductive vias 22) that electrically coupled to the first conductive patterns 14.

The lower substrate 30 may be configured such that second conductive patterns 32, which are conductively connected to the conductive via 22 in the cavity substrate 20, are formed on one surface, and ball lands 34, which are electrically coupled to the second conductive patterns 32 by the conductive vias 22, may be formed on an opposite surface.

Thus, a first semiconductor chip 40, which may comprise a MEMS chip having a membrane 42, may be attached to the semiconductor chip attachment region 12 of the upper substrate 10, and a second semiconductor chip 44, which may comprise an ASIC chip (e.g., an application-specific integrated circuit chip for processing sensor signals from the first semiconductor chip 40), may be attached adjacent to the first semiconductor chip 40.

The first semiconductor chip 40 and the second semiconductor chip 44 (e.g., respective bonding pads thereof) may be electrically coupled by first conductive wires 46, and the second semiconductor chip 44 (e.g., bond pads thereof) and the conductive patterns 14 of the upper substrate 10 may be electrically coupled by second conductive wires 48.

The cavity substrate 20 may then be coupled to one surface of the upper substrate 10 utilizing a conductive adhesive member, such that at the surface where the semiconductor chips 40 and 44 are attached, the conductive patterns 14 of the upper substrate 10 and the via holes 22 of the cavity substrate 20 may be electrically coupled.

The lower substrate 30 may be stacked on and attached to the cavity substrate 20, whereby the via holes 22 in the cavity substrate 20 and the conductive patterns 32 of the lower substrate 30 may be electrically coupled.

Finally, input/output (IO) terminals 36, such as solder balls, may be fused on, coupled to, or formed on the ball lands 34 of the lower substrate 30, thereby completing a MEMS device using three PCBs.

Figure 5:
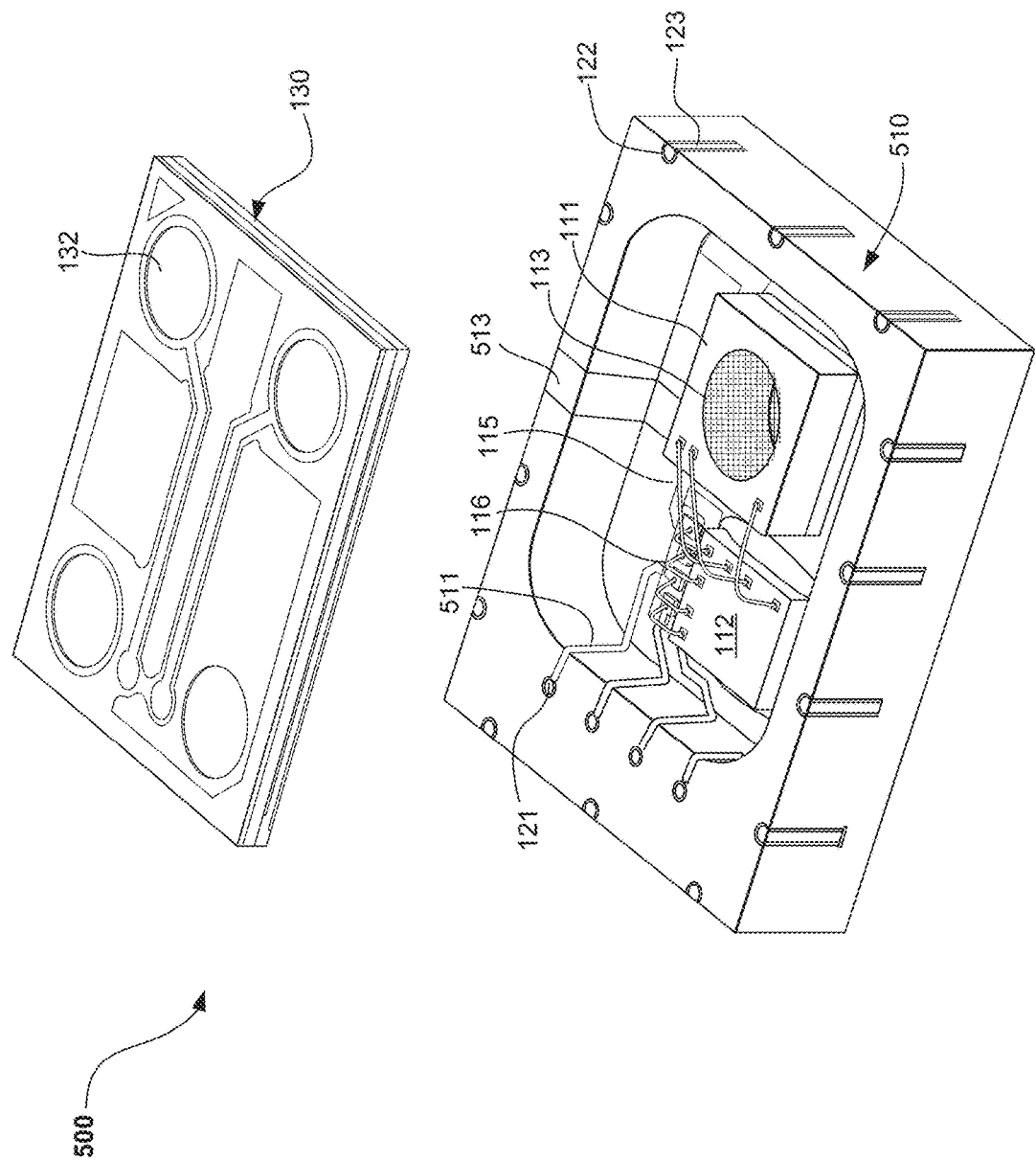
FIG. 5 illustrates a two-piece semiconductor package using a polymer substrate, in accordance with an example embodiment of the disclosure.

FIG. 5 illustrates a two-piece semiconductor package using a polymer substrate, in accordance with an example embodiment of the disclosure. Referring to FIG. 5, there is shown a MEMS device 500 comprising two substrates, that is, a cavity structure 510 and a lower substrate 130. The MEMS device 500 is shown inverted, i.e., with the cavity structure 510 on the bottom to show the interior of the cavity structure 510.

The cavity structure 510 may comprise both a rectangular sheet and a rectangular frame formed in an injection-molding process using a polymer material, for example. A first semiconductor chip 111 and a second semiconductor chip 112 may be attached side by side to the upper substrate 100 molded from polymer material. The cavity structure 510 may comprise a vertical through hole beneath the first semiconductor chip 111.

The first semiconductor chip 111, which may comprise a MEMS chip, has a membrane 113 that senses a sound wave in a hole formed at the center of the chip, so as to be useful in microphones, etc.

A plurality of first conductive patterns 511 may be formed using a plating process on inner surfaces of the cavity structure 510 so that the semiconductor chips 111, 112 may be conductively connected to the cavity structure 510. The patterns 511 may be formed through a plating process before attachment of the semiconductor chips after injection-molding of the cavity structure 510.

In addition, ground shield forming grooves 122 may be formed on the outer surfaces of the cavity structure 510, with the ground shield forming grooves 122 plated with a ground shield material thereby forming ground traces 123.

Bonding pads of the first semiconductor chip 111 and the bonding pads of the second semiconductor chip 112 may be electrically coupled utilizing first conductive wires 115, and bonding pads of the second semiconductor chip 112 and the first conductive patterns 114 of the cavity structure 510 may be electrically coupled utilizing second conductive wires 116.

After injection-molding of the cavity structure 510, a plurality of second conductive patterns 121, which may be conductively connected to the conductive patterns 511 of the upper substrate 110, may be formed through a plating process on the cavity structure 510. Accordingly, the conductive patterns 511 may extend from pads near the chips 111, 112 across the bottom surface of the cavity in the cavity structure 510, up the sidewalls of the cavity, and to a top surface where they are coupled to the second conductive patterns 121.

The mold structure for injection-molding of the cavity structure 510 may be configured to form an injection-molded product for the ground shield forming grooves 122, and thus the ground shield forming grooves 122 may be formed with a desired thickness, or depth, on the outer surface of one or more sides of the cavity structure 510. The ground shield forming grooves 122 may be plated with the ground shield material to form ground traces 123 using a plating process, for example. Other techniques, such as deposition techniques may also be utilized.

One end of the ground traces 123 may be electrically coupled to a ground shield layer of the cavity structure 510, such as the ground shield layer 117 shown in FIG. 2. The lower substrate 130 may be mounted so as to enable the exchange of electrical signals on a mother board of an electronic device (e.g. a microphone, etc.), and may comprise a printed circuit board (PCB) structure for efficient exchange of electrical signals with the electronic device.

The lower substrate 130 may be configured such that a plurality of third conductive patterns 131 may be electrically coupled to the second conductive patterns 121 of the cavity structure 510. The third conductive patterns 131 may be on an opposite surface of the ball lands 132, which may be electrically coupled to the third conductive patterns 131 by conductive vias.

The cavity structure 510 may also comprise a ground trace 513 on the top and inner surface of the cavity down to the bottom surface on which the die 111, 112 are bonded, and may be coupled to a ground shield layer, such as ground shield layer 117 shown in FIG. 2.

When the cavity structure 510 and the lower substrate 130 are stacked by means of a conductive adhesive member, the second conductive patterns 121 of the cavity structure 510 may be electrically coupled to the third conductive patterns 131 of the lower substrate 130.

I/O terminals 134, such as solder balls, may be fused on, bonded to, or formed on the ball lands 132 of the lower substrate 130, thereby completing the fabrication of the MEMS device-type semiconductor package using the polymer substrate according to the present disclosure.

In operation, when a sound wave is introduced to the semiconductor package, the membrane 113 of the first semiconductor chip 111, which is the MEMS chip, vibrates. As such, the membrane 113 easily vibrates as long as a space (or back cavity) is provided behind it.

The vibration signal of the membrane 113 may be transmitted from the first semiconductor chip 111 to the second semiconductor chip 112, which may comprise an ASIC chip (e.g., an application-specific integrated circuit chip for processing sensor signals from the first semiconductor chip 111). The vibration signal may then be processed into an electrical signal, after which the electrical signal may sequentially pass through the first and second conductive patterns 114 and 121 of the cavity structure 510, the third conductive patterns 131 of the lower substrate 130, and then output to a mother board of an electronic device (e.g. a microphone) through the I/O terminals 134 of the lower substrate 130.

Figure 6:
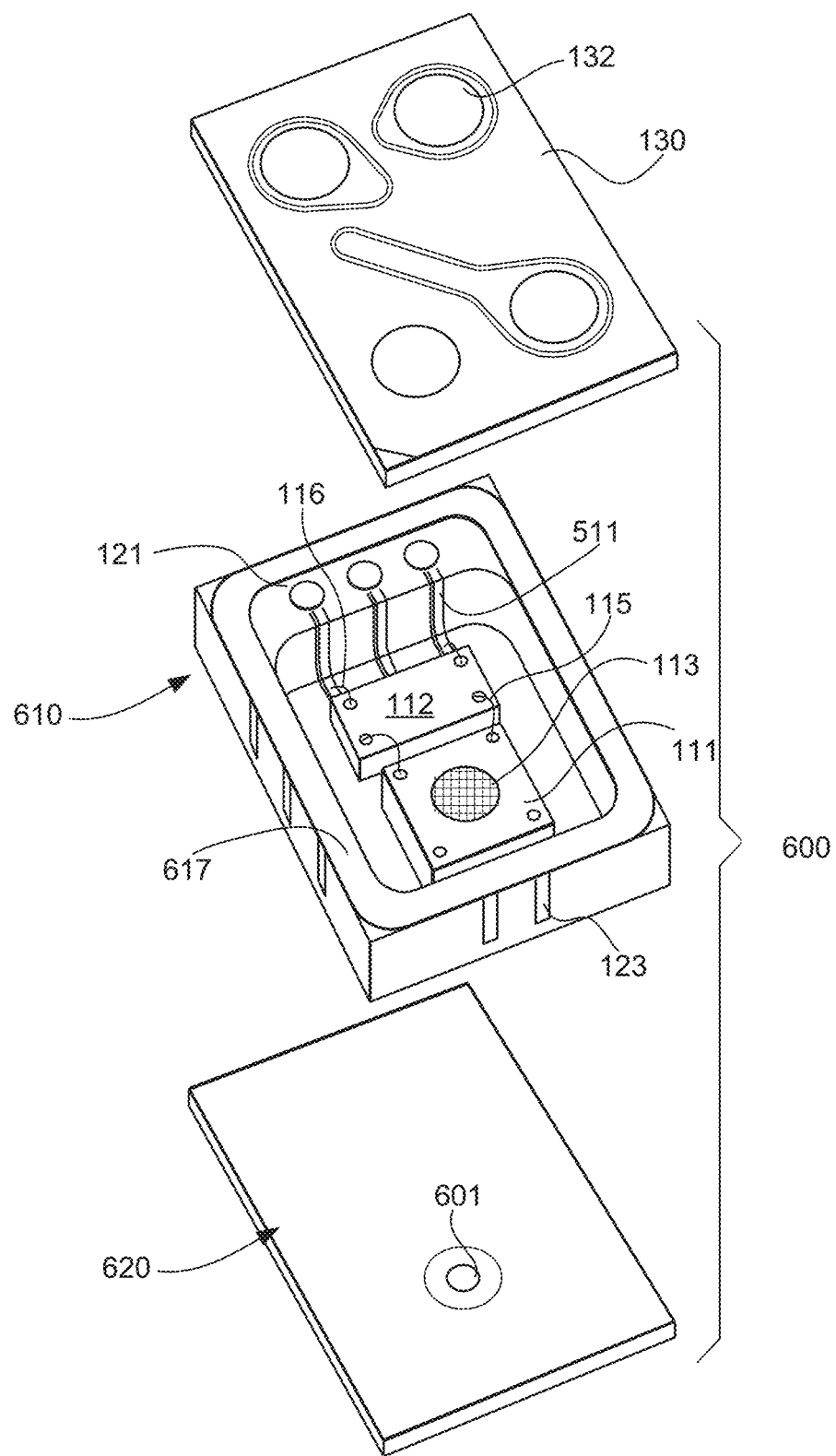
FIG. 6 illustrates a three-piece semiconductor package using a polymer substrate, in accordance with an example embodiment of the disclosure.

FIG. 6 illustrates a three-piece semiconductor package using a polymer substrate, in accordance with an example embodiment of the disclosure. Referring to FIG. 6, there is shown a MEMS device 600 comprising a lower substrate 130, an upper substrate 610, and a lid 620. The MEMS device 600 is shown inverted to illustrate the inner cavity of the upper substrate 610. The lower substrate 130 may be as described previously, and the upper substrate 610 may be similar to the cavity structure 510, formed by injection molding and comprising traces 511 for electrically coupling the conductive patterns 121 to the second semiconductor chip 112.

In addition, a ground trace 617 on the top (as shown) surface of the upper substrate 610 may be coupled to a ground trace on the lower substrate 130. The lid 620 may comprise an injection molded polymer piece for protecting the bottom (as shown) surface of the upper substrate 610 and may comprise an orifice 601 that provides access to the first semiconductor chip 111 (e.g., the MEMS device).

In an example embodiment of the disclosure, a semiconductor package using a polymer substrate may be provided, wherein a total of three substrates, including an upper substrate, a lower surface, and a cavity substrate interposed between the upper and the lower substrate, may be provided, and the upper substrate and the cavity substrate, may be injection-molded utilizing a polymer material, and conductive patterns may be plated on the surfaces thereof, thus considerably reducing the manufacturing cost, as well as decreasing the number of manufacturing processes.

In an example embodiment, a semiconductor device may comprise a polymer substrate comprising first metal traces on a first surface of the polymer substrate, a micro-electro mechanical systems (MEMS) device and a semiconductor die bonded to the first surface (the semiconductor die electrically coupled to at least one of the first metal traces), a polymer cavity substrate coupled to the first surface of the polymer substrate and encircling the MEMS device and the semiconductor die (the polymer cavity substrate comprising second metal traces electrically coupled to at least a subset of the first metal traces), and a third substrate coupled to the cavity substrate and comprising third metal traces coupled to the second metal traces.

A ground trace may be on an outer surface of the polymer cavity substrate. Ball lands may be on a surface of the third substrate opposite to a surface with the third metal traces. The second metal traces may extend from the first metal traces up a sidewall of the polymer cavity substrate and to a top surface of the polymer cavity substrate. The second metal traces may extend to conductive patterns on the top surface of the polymer cavity substrate, where the conductive patterns are for electrically coupling to the third metal traces of the third substrate. A ground trace may be on an inside surface of the polymer cavity substrate. Wire bonds may electrically couple the semiconductor die to the first metal traces. Wire bonds may electrically couple the MEMS device to the semiconductor die. The polymer cavity substrate may comprise a ground shield layer that is electrically coupled to one or more of the third metal traces in the third substrate.

The present disclosure provides a semiconductor package using a polymer substrate, comprising: an upper substrate injection-molded polymer material; a first semiconductor chip having a membrane and a second semiconductor chip as an ASIC chip, which are attached side by side on the upper substrate; a plurality of first conductive patterns plated on one side of the upper substrate; a first conductive wire for electrically connecting the first semiconductor chip and the second semiconductor chip a second conductive wire for electrically connecting the second semiconductor chip to the first conductive patterns; a cavity substrate, which may comprise an injection-molded polymer material so as to have a through hole that is vertically formed, and which may be stacked on the upper substrate. A plurality of second conductive patterns may be plated on one surface and an inner wall of the cavity substrate so as to be electrically coupled to the first conductive patterns, and a lower substrate that may be configured such that a plurality of third conductive patterns, which are connected to the second conductive patterns of the cavity substrate, may be formed on one surface thereof and ball lands, which may be connected to the third conductive patterns by vias, may be formed on an opposite surface of the lower substrate, and which may comprise a PCB stacked on the cavity substrate.

The cavity substrate may be injection-molded using a polymer material, a ground shield forming groove may be on an outer surface of one or more sides of the cavity substrate, and the ground shield forming groove may be plated with a ground shield material, which may be electrically coupled to the third conductive patterns of the lower substrate. An edge of the upper substrate may be plated with a ground shield layer. Various advantages may be realized utilizing the structures of the present disclosure. First, an injection-molded polymer material may be utilized to form a cavity substrate, and conductive patterns for connection to a lower substrate are provided using a plating process on the molded surfaces, thus significantly reducing the manufacturing cost.

Second, instead of performing high-cost via hole drilling in the cavity substrate, the upper substrate and the cavity substrate, which are molded from polymer material according to the present disclosure may be formed with conductive patterns through a low-cost plating process, thus further reducing the manufacturing cost, as well as decreasing the number of manufacturing processes.

While various aspects supporting the disclosure have been described with reference to certain example embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular example embodiments disclosed, but that the present disclosure will include all embodiments falling within the scope of the appended claims.

What is claimed is:
1. A semiconductor device, comprising:
   a first substrate comprising an inner surface and an outer surface;
   a polymer substrate comprising:
      sidewalls, each sidewall comprising a top surface coupled to the inner surface of the first substrate;
      a cavity comprising a cavity bottom surface and cavity sidewall surfaces, wherein the cavity sidewall surfaces are provided by inner surfaces of the sidewalls;

a ground path on an outer surface of a first sidewall of the sidewalls, the inner surface and the outer surface of the first sidewall defining a thickness of the first sidewall; and a signal trace that extends on the cavity bottom surface and that extends on the inner surface of the first sidewall;

a micro-electro mechanical systems (MEMS) device within the cavity of the polymer substrate; and a semiconductor die within the cavity of the polymer substrate and electrically coupled to the MEMS device and the signal trace.

2. The semiconductor device of claim 1, wherein a signal output of the semiconductor die is electrically coupled the signal trace.

3. The semiconductor device of claim 1, wherein the signal trace comprises:

a first surface in direct contact with the inner surface of the first sidewall; and a second surface, opposite the first surface, that is exposed.

4. The semiconductor device of claim 1, wherein the ground path is laterally bounded by portions of the outer surface of the first sidewall.

5. The semiconductor device of claim 1, wherein the MEMS device and the semiconductor die are mounted to the cavity bottom surface.

6. The semiconductor device of claim 1, further comprising:

a first wire bond that electrically couples the semiconductor die to the signal trace; and a second wire bond that electrically couples the MEMS device to the semiconductor die.

7. The semiconductor device of claim 1, wherein a portion of the signal trace lies on the top surface of the first sidewall.

8. The semiconductor device of claim 7, further comprising:

a conductive pattern on the inner surface of the first substrate, the conductive pattern coupled to the portion of the signal trace on the top surface of the first sidewall;

a conductive land on the outer surface of the first substrate; and a conductive via through the first substrate that couples the conductive land to the conductive pattern.

9. The semiconductor device of claim 8, wherein:

the first substrate comprises a first ground path layer on its inner surface;

the polymer substrate comprises a second ground path layer on its a top surface of the polymer substrate; and the first ground path layer contacts the second ground path layer.

10. The semiconductor device of claim 9, further comprising a ground shield layer that traverses the cavity bottom surface and that is coupled to first ground path layer of the first substrate via the second ground path layer of the polymer substrate.

11. A semiconductor device, comprising:

a polymer structure comprising a cavity defined by a cavity bottom surface and sidewall inner surfaces provided by sidewalls of the polymer structure;

a micro-electro mechanical systems (MEMS) device within the cavity of the polymer structure;

a semiconductor die within the cavity of the polymer structure and electrically coupled to the MEMS device;

a signal trace coupled to a signal output of the semiconductor die, the signal trace extending on the cavity bottom surface and extending on a first sidewall inner surface of the sidewall inner surfaces;

ground paths on sidewall external surfaces provided by the sidewalls of the polymer structure, wherein each sidewall external surface is separated from a respective sidewall inner surface by a thickness of a respective sidewall of the polymer structure and each of the ground paths is laterally bounded by polymer portions of the sidewall external surfaces; and a substrate coupled to the polymer structure, wherein the substrate comprises a ground shield layer coupled to the ground paths, and wherein the substrate encloses the MEMS device and the semiconductor die within the cavity.

12. The semiconductor device of claim 11, comprising a conductive land on a surface of the substrate opposite to the cavity.

13. The semiconductor device of claim 11, wherein the signal trace extends to a top surface of the polymer structure.

14. The semiconductor device of claim 13, wherein the signal trace is coupled to a conductive pattern on the top surface of the polymer structure.

15. The semiconductor device of claim 11, further comprising a ground path on a second sidewall inner surface of the inner sidewall surfaces.

16. The semiconductor device of claim 11, further comprising:

a first wire bond that electrically couples the semiconductor die to the signal trace; and a second wire bond that electrically couples the MEMS device to the semiconductor die.

17. The semiconductor device of claim 11, wherein:

the MEMS devices is mounted to the cavity bottom surface; and the polymer structure comprises an orifice through the cavity bottom surface, the orifice positioned under the MEMS device.

18. The semiconductor device of claim 11, wherein:

a portion of the signal trace lies on a top surface of the polymer structure; and the substrate comprises:

a conductive pattern on an inner surface of the substrate, the conductive pattern coupled to the portion of the signal trace on the top surface of the polymer structure;

a conductive land on an outer surface of the substrate; and a conductive via through the substrate that couples the conductive land to the conductive pattern.

19. The semiconductor device of claim 11, wherein the polymer structure further comprises a ground shield layer that traverses the cavity bottom surface and that is coupled to the ground shield layer of the substrate via the ground paths of the polymer structure.

20. A method of fabricating a semiconductor device, the method comprising:

coupling a micro-electro mechanical systems (MEMS) device to a cavity bottom surface of a cavity in a polymer structure, the cavity defined by the cavity bottom surface and sidewall inner surfaces provided by sidewalls of the polymer structure, and the polymer structure comprising a signal trace extending on the cavity bottom surface and extending on a first sidewall inner surface of the sidewall inner surfaces;

coupling a semiconductor die to the cavity bottom surface such that a signal output of the semiconductor die is coupled to the signal trace; and coupling a substrate to the polymer structure such that the substrate encloses the MEMs device and the semiconductor die within the cavity and electrically couples a ground shield layer of the substrate to ground paths on sidewall external surfaces of the polymer structure, wherein each sidewall external surface is separated from a respective sidewall inner surface by a thickness of a respective sidewall of the polymer structure.

* * * * *